United States Patent
Araya et al.

(12) 
(10) Patent No.: US 6,435,808 B1
(45) Date of Patent: Aug. 20, 2002

(54) CHIP-TYPE CIRCUIT ELEMENT MOUNTING APPARATUS

(75) Inventors: Shinichi Araya, Honjou; Kouji Kudou, Akita-ken; Akihiro Katou, Akita-ken; Hitoshi Nakayama, Akita-ken; Masakazu Toki, Akita-ken; Kazuya Abe, Akita-ken, all of (JP)

(73) Assignee: TDK Corporation (JP)

( * ) Notice: Subject to any disclaimer, the term of this patent is extended or adjusted under 35 U.S.C. 154(b) by 0 days.

(21) Appl. No.: 09/722,907

(22) Filed: Nov. 27, 2000

Related U.S. Application Data

(62) Division of application No. 09/264,996, filed on Mar. 9, 1999, now Pat. No. 6,152,679, which is a division of application No. 08/631,827, filed on Dec. 28, 1995, now Pat. No. 5,878,484, which is a continuation of application No. 08/132,697, filed on Oct. 6, 1993, now abandoned.

(51) Int. Cl.[7] ............................................. B65G 1/133
(52) U.S. Cl. ................... 414/783; 414/752.1; 294/64.1; 901/47
(58) Field of Search ................................ 414/754, 783, 414/751.1, 277, 281, 752.1; 29/740, 721, 743, 833; 294/64.1; 401/47

(56) References Cited

U.S. PATENT DOCUMENTS

| | | | |
|---|---|---|---|
| 4,889,229 A | 12/1989 | Tamamoto et al. | 206/328 |
| 5,018,936 A | 5/1991 | Izumi et al. | 414/752 |
| 5,033,783 A | 7/1991 | Izumi et al. | 294/64.1 |
| 5,086,559 A | 2/1992 | Akatsuchi | 29/834 |
| 5,193,268 A | 3/1993 | Ono et al. | 29/739 |
| 5,195,234 A | 3/1993 | Pine et al. | 29/720 |
| 5,249,349 A | 10/1993 | Kuinose et al. | 29/721 |
| 5,277,540 A | 1/1994 | Helms et al. | 414/751 |
| 5,456,001 A | 10/1995 | Mori et al. | 29/739 |
| 5,515,600 A | 5/1996 | Iwasaki et al. | 29/740 |
| 5,658,122 A | 8/1997 | Ohashi et al. | 414/749 |
| 5,660,519 A * | 8/1997 | Ohta et al. | 414/783 |
| 5,713,125 A | 2/1998 | Watanabe et al. | 29/740 |

FOREIGN PATENT DOCUMENTS

| | | |
|---|---|---|
| JP | 62/246437 | 10/1987 |
| JP | 262099 | 3/1990 |
| JP | 263199 | 3/1990 |
| JP | 322720 | 3/1991 |
| JP | 350438 | 8/1991 |
| JP | 3-203399 | 9/1991 |
| JP | 3-206699 | 9/1991 |
| JP | 464289 | 2/1992 |
| JP | 465895 | 3/1992 |
| JP | 4-179200 | 6/1992 |

OTHER PUBLICATIONS

"Chip–Placement Alignment Technique" IBM Technical Disclosure Bulletin, vol. 27, No. 6, Nov. 1984, pp. 3653–3655.

* cited by examiner

*Primary Examiner*—Richard Chilcot
*Assistant Examiner*—Andrew Joseph Rudy
(74) *Attorney, Agent, or Firm*—Lerner, David, Littenberg, Krumholz & Mentlik, LLP

(57) ABSTRACT

A chip mounting apparatus capable of permitting a chip mounting operation to be executed at an increased speed and ensuring continuous running of the apparatus over a long period of time. The apparatus includes a chip observing camera mounted on the side of a chip mounting head, a lighting unit mounted on the side of the chip mounting head to light a background of a chip hold on a chip suction nozzle of the head, a reflection unit mounted on the side of the chip mounting head to input an image of the chip to the chip observing camera, feeder and stocker sections each adapted to replaceably held a chip storage package therein, and a package replacement mechanism for carrying out replacement of the chip storage package between both sections.

10 Claims, 11 Drawing Sheets

CHIP-TYPE CIRCUIT ELEMENT MOUNTING APPARATUS

CROSS REFERENCE TO RELATED APPLICATIONS

The present application is a divisional of U.S. patent application Ser. No. 09/264,996 filed Mar. 9, 1999, now U.S. Pat. No. 6,152,679, which in turn is a divisional of U.S. patent application Ser. No. 08/631,827, filed Dec. 28, 1995, now U.S. Pat. No. 5,878,484. Said application Ser. No. 08/631,827 was a continuation of U.S. patent application Ser. No. 08/132,697 filed Oct. 6, 1993, now abandoned.

BACKGROUND OF THE INVENTION

This invention relates to a chip-type circuit element mounting apparatus adapted to handle a chip-type circuit element storing package of a disc-like shape provided therein with a spirally continuous path for receiving chip-type circuit elements therein, and more particularly to a chip-type circuit element mounting apparatus for mounting a chip-type circuit element on a printed circuit board while picking up, by means of a camera, an image of a chip-type circuit element held on a chip mounting head through a chip suction nozzle.

In a conventional chip-type circuit element mounting apparatus (hereinafter referred to as "chip mounting apparatus") which is adapted to mount a chip-type circuit element (hereinafter referred to as "chip") on a printed circuit board, a chip observing camera is fixedly arranged on the side of a body of the chip mounting apparatus. Such arrangement requires moving a chip mounting head to a position of the chip observing camera and then temporarily stopping it at the position or passing it through the position at a predetermined speed in order to pick up an image of a chip held on the chip mounting head through a chip suction nozzle attached to the chip mounting head.

Unfortunately, temporary stoppage of the chip mounting head at the position of the chip observing camera or passage of the former through the latter at a predetermined speed leads to a problem of reducing a speed at which the chip is mounted on the printed circuit board.

Also, a lighting unit required for observing an image of a chip mounted on the chip mounting head through the chip suction nozzle by image processing is divided into two types. One of them is so constructed that a reflection plate is arranged behind the chip suction nozzle to reflect light emitted by the lighting unit, wherein the light is horizontally or upwardly directed to the reflection plate. The other type includes an illuminant arranged behind the suction nozzle.

The prior art permits an outer diameter of the chip suction nozzle of the chip mounting apparatus to be set to be smaller than an outer configuration of a chip, to thereby prevent the chip suction nozzle from interfering with picking-up of an image of a chip through a camera.

However, recent microminiaturization of a chip causes manufacturing of a chip suction nozzle having an outer diameter smaller than a size of the chip to be highly difficult. When an outside dimension of a distal end surface of the suction nozzle exceeds that of a chip held on the chip suction nozzle, an inner side of a contour of the distal end surface of the chip suction nozzle forms a shadow as well, resulting in proper observation of an image of the chip held on the chip suction nozzle being highly difficult.

The assignee proposed a chip mounting apparatus in which a chip storage package of a disc-like configuration is held in a feeder section. The chip storage package is formed therein with a spirally continuous packing path in which a number of chips are stored in a row. The chip storage package provides good replaceability, therefore, use of the chip storage package in the feeder section permits a chip-free or empty chip storage package to be readily replaced with a new chip storage package filled with chips, to thereby ensure continuous feeding of chips from the feeder section to the chip mounting head. This leads to continuous running of the chip mounting apparatus over a long period of time without causing shortage of chips.

When the chip storage package received in the feeder section of the chip mounting apparatus is emptied of chips, it is required to execute an operation of removing the empty chip storage package from the feeder section to return it to an empty chip storage package collecting space of a stocker section and an operation of removing a new chip storage package filled with chips from the stocker section to feed it to the feeder section in order. Thus, a disadvantage of requiring much time for replacement of the chip storage package is encountered with the conventional chip mounting apparatus.

Further, in the case that various kinds of chip storage packages are arranged in the feeder section of the chip mounting apparatus, it is required to identify, on a side of a chip storage package replacement means, a type of chips stored in each of the chip storage packages when it is carried out to remove an empty chip storage package from the feeder section and feed a new chip storage package filled with chips from the stocker section to the feeder section. Thus, it is highly desirable to develop a means of readily and positively identifying a type of chips stored in each of chip storage packages.

In addition, the conventional chip mounting apparatus is generally constructed in such a manner that a height of a chip is detected to control downward movement of the chip mounting head for mounting of the chip on a printed circuit board depending on the height, to thereby render a pressure applied to chips different in height constant. However, such controlling of downward movement of the chip mounting head is deteriorated due to a variation in height of the printed circuit board due to warpage or twist of the board or the like, leading to unexpected damage to chips.

SUMMARY OF THE INVENTION

The present invention has been made in view of the foregoing disadvantages of the prior art.

Accordingly, it is an object of the present invention to provide a chip mounting apparatus which is provided with a chip observing camera on the side of a chip mounting head.

It is another object of the present invention to provide a chip mounting apparatus which is capable of permitting an image of a chip to be picked up during movement of a chip mounting head, to thereby increase a chip mounting speed.

It is a further object of the present invention to provide a chip mounting apparatus which is capable of automatically carrying out replacement of a chip storage package to accomplish running of the apparatus over an increased period of time.

It is still another object of the present invention to provide a chip mounting apparatus which is capable of permitting a chip suction nozzle of a chip mounting head to act as a lighting means as well, to thereby appropriately light even a microminiature chip.

It is yet another object of the present invention to provide a chip mounting apparatus which is capable of rapidly and positively carrying out replacement of a chip storage package between a feeder section of the chip mounting apparatus and its stocker section.

It is even another object of the present invention to provide a chip mounting apparatus which is capable of indicating a type of chips stored in a chip storage package by means of a bar code provided on an outer surface of the chip storage package so as to be read by a bar code reader arranged on the side of a package replacement mechanism, to thereby smoothly and positively carry out replacement of chip storage packages even when various kinds of chip storage packages are held in feeder and stocker sections.

It is a still further object of the present invention to provide a chip mounting apparatus which is capable of permitting a height or vertical position of a printed circuit board to be detected for every chip at a location where the chip is to be mounted on the printed circuit board, to thereby minimize damage to the chip during the chip mounting operation.

It is a yet further object of the present invention to provide a chip mounting head unit having a camera integrally mounted thereon for a chip mounting apparatus.

It is an even further object of the present invention to provide a lighting unit for a chip mounting apparatus which is capable of effectively and satisfactorily lighting even a microminiature chip when it is mounted on a chip mounting head through a chip suction nozzle thereof.

It is an additional object of the present invention to provide a package replacement unit for a chip mounting apparatus which is capable of rapidly and positively carrying out replacement of a chip storage package between a feeder section of the apparatus and its stocker section.

It is another object of the present invention to provide a package replacement unit for a chip mounting apparatus which is capable of indicating a type of chips stored in a chip storage package by means of a bar code provided on an outer surface of the chip storage package so as to be read by a bar code reader arranged on the side of a package replacement mechanism, to thereby smoothly and positively carry out replacement of chip storage packages even when various kinds of chip storage packages are held in feeder and stocker sections of the apparatus.

It is a further object of the present invention to provide a chip mounting head for a chip mounting apparatus which is capable of permitting a height or vertical position of a printed circuit board to be detected for every chip at a location where the chip is to be mounted on the printed circuit board, to thereby minimize damage to the chip during the chip mounting operation.

In accordance with the present invention, a chip mounting apparatus is provided. The chip mounting apparatus includes a chip mounting head including a chip suction nozzle for holding a chip thereon by suction, a chip observing camera mounted on the side of the chip mounting head, a lighting means mounted on the side of the chip mounting head to light a background of the chip held on the chip suction nozzle, a reflection means mounted on the side of the chip mounting head to input an image of the chip held on the chip suction nozzle to the chip observing camera, and a feeder section for replaceably holding a chip storage package which has chips stored therein. The chip mounting apparatus also includes a stocker section for replaceably stocking a chip storage package for supply and a package replacement mechanism for carrying out replacement of each of the chip storage packages between the feeder section and the stocker section.

In a preferred embodiment of the present invention, a board mark observing camera is mounted on the side of the chip mounting head.

In a preferred embodiment of the present invention, the storage replacement mechanism includes a plurality of hand sections each constructed so as to hold a chip storage package thereon.

In a preferred embodiment of the present invention, the reflection means includes a first plane mirror obliquely arranged at a position below the chip suction nozzle and a second plane mirror obliquely arranged at a position below the chip observing camera. The first and second plane mirrors of the reflection means reflect an image of a lower surface of the chip held on the chip suction nozzle to input the image to the chip observing camera. Alternatively, only the second plane mirror of the reflection means may reflect an image of a side surface of the chip held on the chip suction nozzle to input the image to the chip observing camera. The first plane mirror may be arranged so as to be retractable to a position apart from the position below the chip suction nozzle.

In a preferred embodiment of the present invention, the lighting means comprises a translucent nozzle cap fitted on a nozzle body of the chip suction nozzle and having a distal end surface for holding a chip thereon by suction, an annular bracket made of an opaque material and formed on an inner peripheral surface thereof with a slit and a plurality of light emitting diodes mounted on the bracket to laterally light the nozzle cap through the slit. The annular bracket is arranged so as to surround the nozzle cap.

In a preferred embodiment of the present invention, the package replacement mechanism includes a plurality of hand sections each provided with an engagement means in a manner to be openable. In the embodiment, the package replacement mechanism may further include an X-Z direction drive mechanism arranged so as to be movable in longitudinal and vertical directions of the feeder section and stocker section and Y-direction drive mechanisms provided independent from each other for the hand sections and arranged so as to be movable in a Y direction, wherein the hand sections are mounted on the X-Z direction drive mechanism through the Y-direction drive mechanisms, to thereby be movable independent from each other in the Y direction.

In a preferred embodiment of the present invention, the chip mounting apparatus further comprises a bar code reader arranged on the package replacement mechanism. The chip storage package is provided thereon with a bar code for indicating a type of chips stored therein, which is read by the bar code reader to identify a chip storage package to be replaced. The bar code may be provided on an end surface of a side of the chip storage package on which an engagement means for replacement is arranged.

In a preferred embodiment of the present invention, the printed circuit board is provided on a surface thereof with a positioning mark through which the chip is to be mounted on the printed circuit board. The camera picks up an image of the positioning mark, to thereby measure a distance between the camera and the surface of the printed circuit board. The chip to be mounted on the printed circuit board may be a surface-mounting type.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference characters like or corresponding parts throughout: wherein.

DETAILED DESCRIPTION OF THE
PREFERRED EMBODIMENT

Now, a chip mounting apparatus according to the present invention will be described hereinafter with reference to the accompanying drawings.

Figure 1:
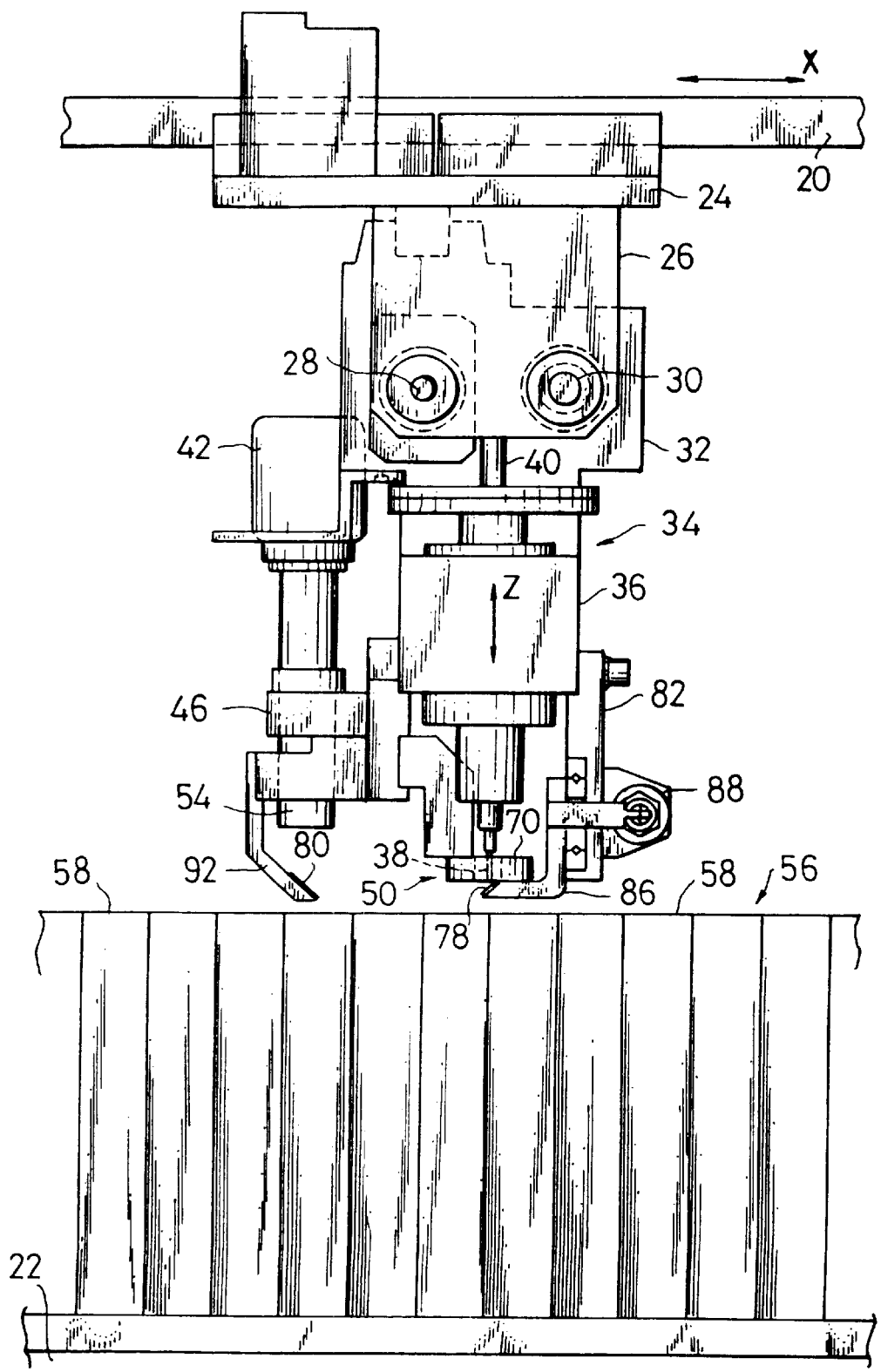
FIG. 1 is a front elevation view showing an embodiment of a chip mounting apparatus according to the present invention.
Figure 2:
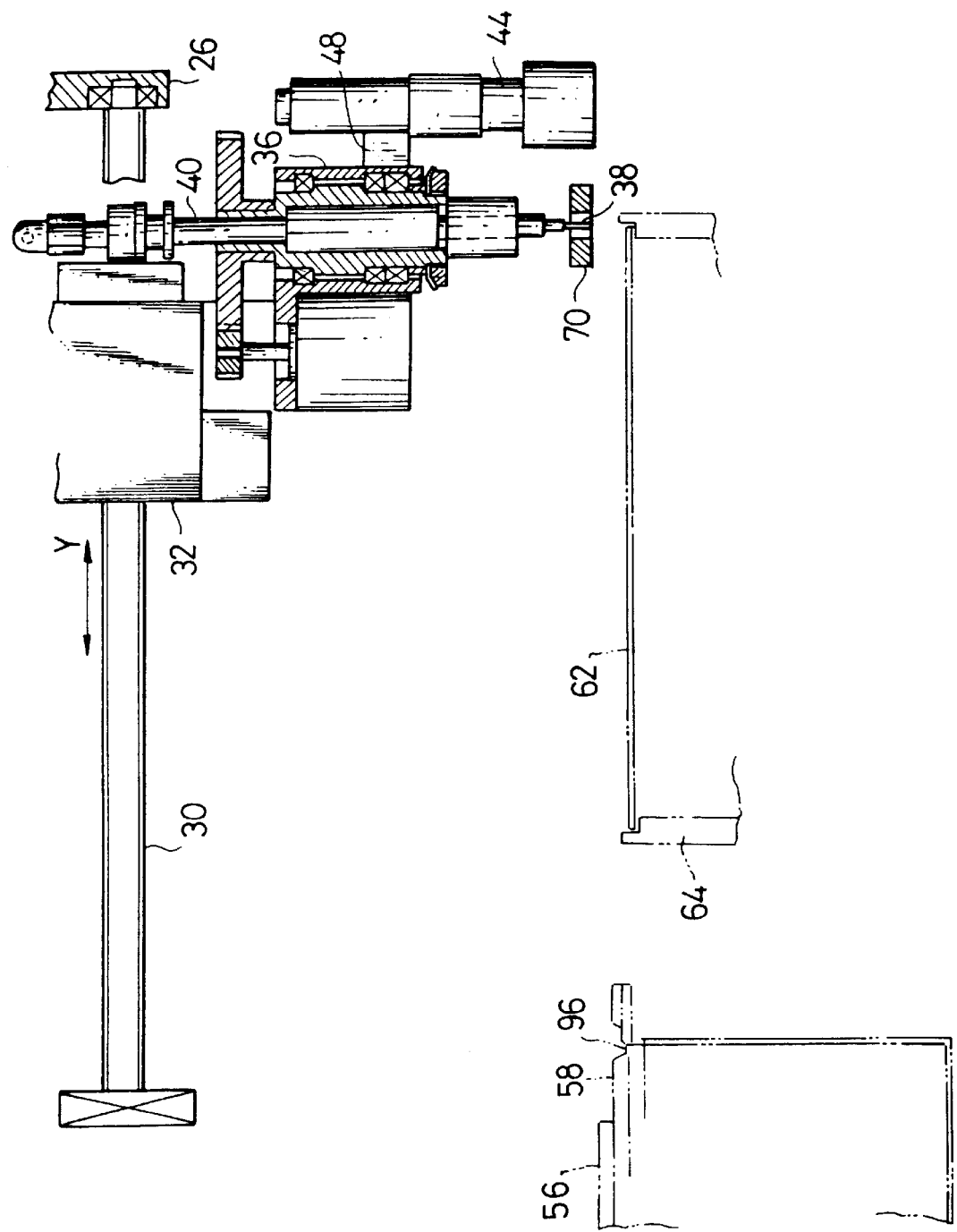
FIG. 2 is a sectional side elevation view of the chip mounting apparatus shown in FIG. 1.
Figure 3:
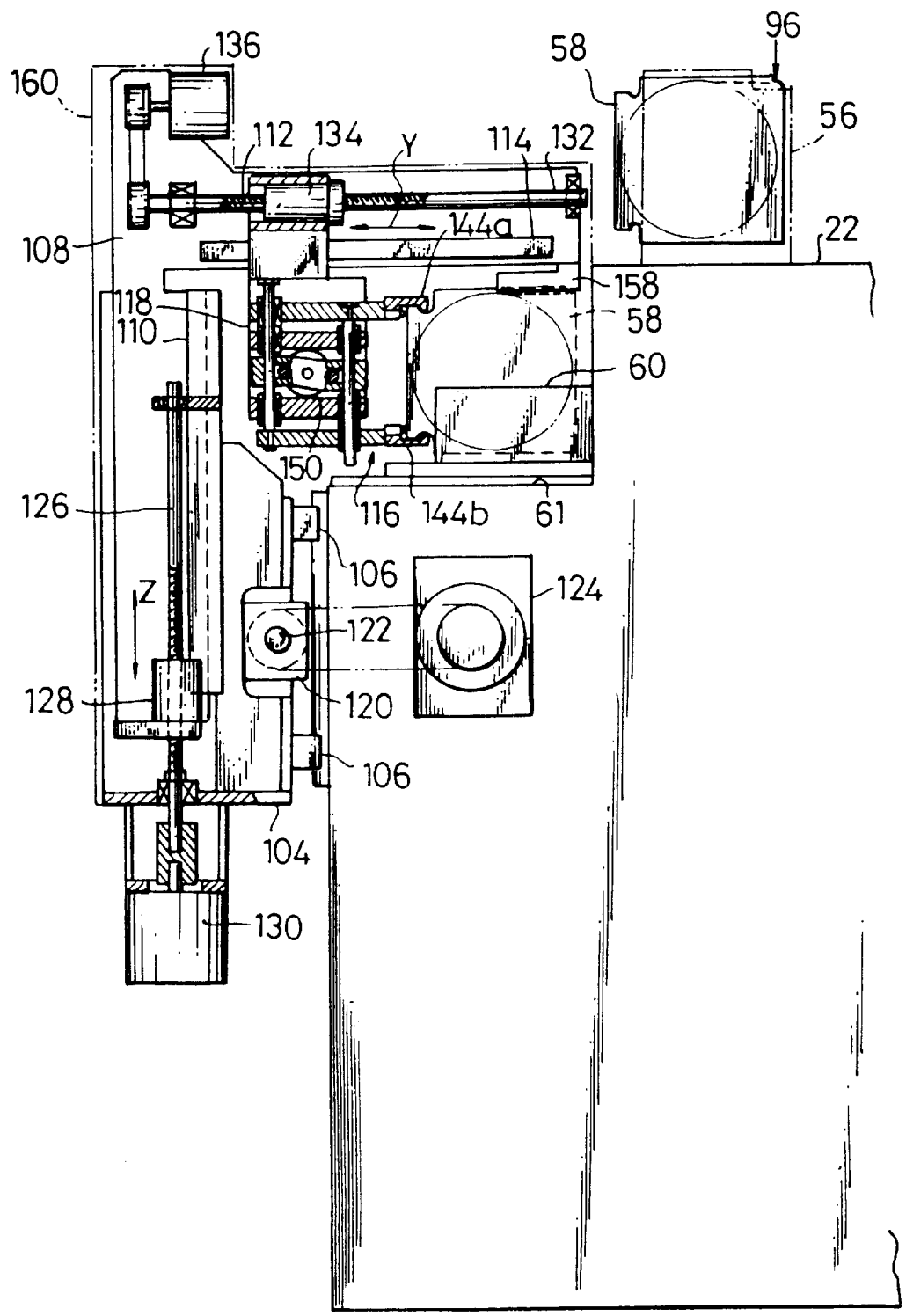
FIG. 3 is a sectional side elevation view showing a package replacement unit incorporated in the chip mounting apparatus shown in FIG. 1.

Referring first to FIGS. 1 to 3, an embodiment of a chip mounting apparatus according to the present invention is generally illustrated. A chip mounting apparatus of the illustrated embodiment includes an X-direction guide rail 20 which is supported on a frame mounted on a base 22 so as to vertically extend therefrom. The X-direction guide rail 20 is mounted thereon with an X-direction slider 24. The X-direction slider 24 is driven or moved in an X-direction through an X-direction drive means. The X-direction slider 24 is integrally provided with a bracket 26, on which a Y-direction guide shaft 28 is fixed. Also, a Y-direction worm screw shaft 30 is rotatably supported on the bracket 26. The Y-direction guide shaft 28 is inserted through a Y-direction slide block 32, which is threadedly engaged with the Y-direction worm screw shaft 30. Thus, rotation of the Y-direction worm screw shaft 30 causes the Y-direction slide block 32 to be moved in a Y direction.

The chip mounting apparatus of the illustrated embodiment also includes a chip mounting head unit 34. In the illustrated embodiment, the chip mounting head unit 34 may be constructed into a camera integrated type. The chip mounting head unit 34 of the camera integrated type includes a chip mounting head 36 fixedly mounted on the Y-direction slide block 32 and provided at a lower portion thereof with a chip suction nozzle 38. The chip suction nozzle 38 is arranged so as to be moved vertically or in a Z direction in association with vertical movement of a vertical shaft 40 upwardly projected from the chip mounting head 36. The chip mounting head 36, as shown in FIGS. 1 and 2, is also mounted thereon with a chip observing camera 42 and a board mark observing camera 44 through fixtures 46 and 48, respectively. Further, the chip mounting head 36 is provided thereon with a lighting unit 50 and a reflection means, which will be more detailedly described hereinafter. Reference numeral 54 designates a lens mounted on the chip observing camera 42.

The base 22, as shown in FIG. 3, is provided thereon with a feeder section 56 for replaceably holding at least one chip storage package 58 which is formed therein with a spirally continuous packing path for storing chips therein. Also, the base 22 is provided thereon with a stocker section 60 for replaceably holding at least one chip storage package 58 filled with chips through the spirally continuous packing path. The stocker section 60 is arranged at a position 61 below the feeder section 56. The feeder section 56 and stocker section 60 each are provided with a guide or the like for permitting the chip storage package 58 to be accessed thereto while keeping it erected.

Reference numeral 62 (FIG. 2) designates a printed circuit board, which is supported at a predetermined position by means of a board positioning mechanism 64.

Figure 4:
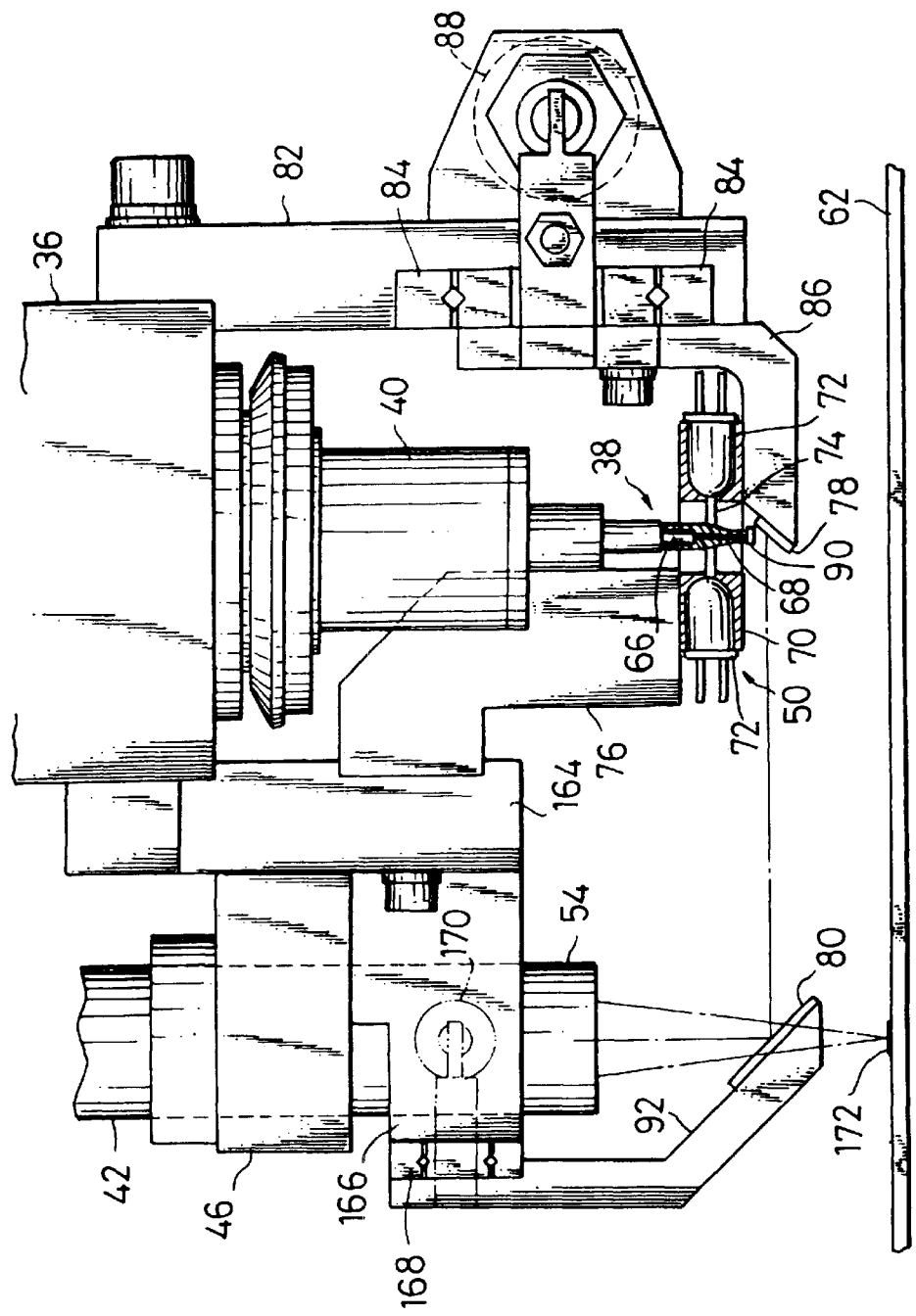
FIG. 4 is an enlarged sectional front elevation view showing a mechanism for picking up an image of a chip held on a suction nozzle of a chip mounting head.

The chip suction nozzle 38 of the chip mounting head 36, as shown in FIG. 4, includes a nozzle body 66 made of a metal material or the like and a nozzle cap 68 detachably fitted on the nozzle body 66. The nozzle cap 68 is made of a semi-opaque (translucent) resin material, to thereby exhibit a function of partially transmitting light and irregularly reflecting it.

The lighting unit 50 is arranged so as to laterally irradiate the nozzle cap 68 with light during movement of the chip mounting head 36 or when the chip suction nozzle 38 is at a raised position. For this purpose, the lighting unit 50 includes an annular bracket 70 made of an opaque material such as aluminum or the like and a plurality of light emitting diodes (LEDs) 72 fixed in the bracket 70. The annular bracket 70 is formed on an inner peripheral surface thereon with a circumferentially extending slit 74, through which light laterally emitted from the light emitting diodes 72 is irradiated to the nozzle cap 68. The bracket 70 is mounted through a support arm 76 on the side of the chip mounting head 36, so that the nozzle cap 68 may be laterally irradiated with light when the chip suction nozzle 38 is moved to the raised position.

The reflection means briefly described above is obliquely arranged below the chip suction nozzle 38, as shown in FIG. 4. More particularly, the reflection means includes a first plane mirror 78 obliquely arranged at an oblique angle of about 45 degrees with respect to an extension of a central axis of the chip suction nozzle 38 (or a vertical line) and a second plane mirror 80 obliquely arranged at an oblique angle of about 45 degrees with respect to an extension of a central axis of the chip observing camera 42 (or a vertical line) so as to receive light reflected by the first plane mirror 78. The chip mounting head 36 is fixedly mounted on a side surface thereof with a mounting plate 82, which is mounted through a linear guide 84 with a support arm 86 so as to be movable in a direction perpendicular to the sheet of FIG. 4 or in the Y direction. The first plane mirror 78 is fixed on an oblique distal end surface of the support arm 86. Driving of the support arm 86 in the Y direction is carried out through an air cylinder 88 mounted on the mounting plate 82. Such arrangement of the support arm 86 and first plane mirror 78 so as to be movable in the Y direction permits the support arm 86 and first plane mirror 78 to be laterally shifted from a position right below the chip suction nozzle 38, resulting in preventing the support arm 86 and first plane mirror 78 from interfering with suction of a chip 90 from the feeder section 56 and mounting of the chip on the printed circuit board 62 which are carried out by the chip suction nozzle 38. The second plane mirror 80 is securely mounted on an oblique distal end surface of a support arm 92 fixed on the fixture 46.

Figure 5:
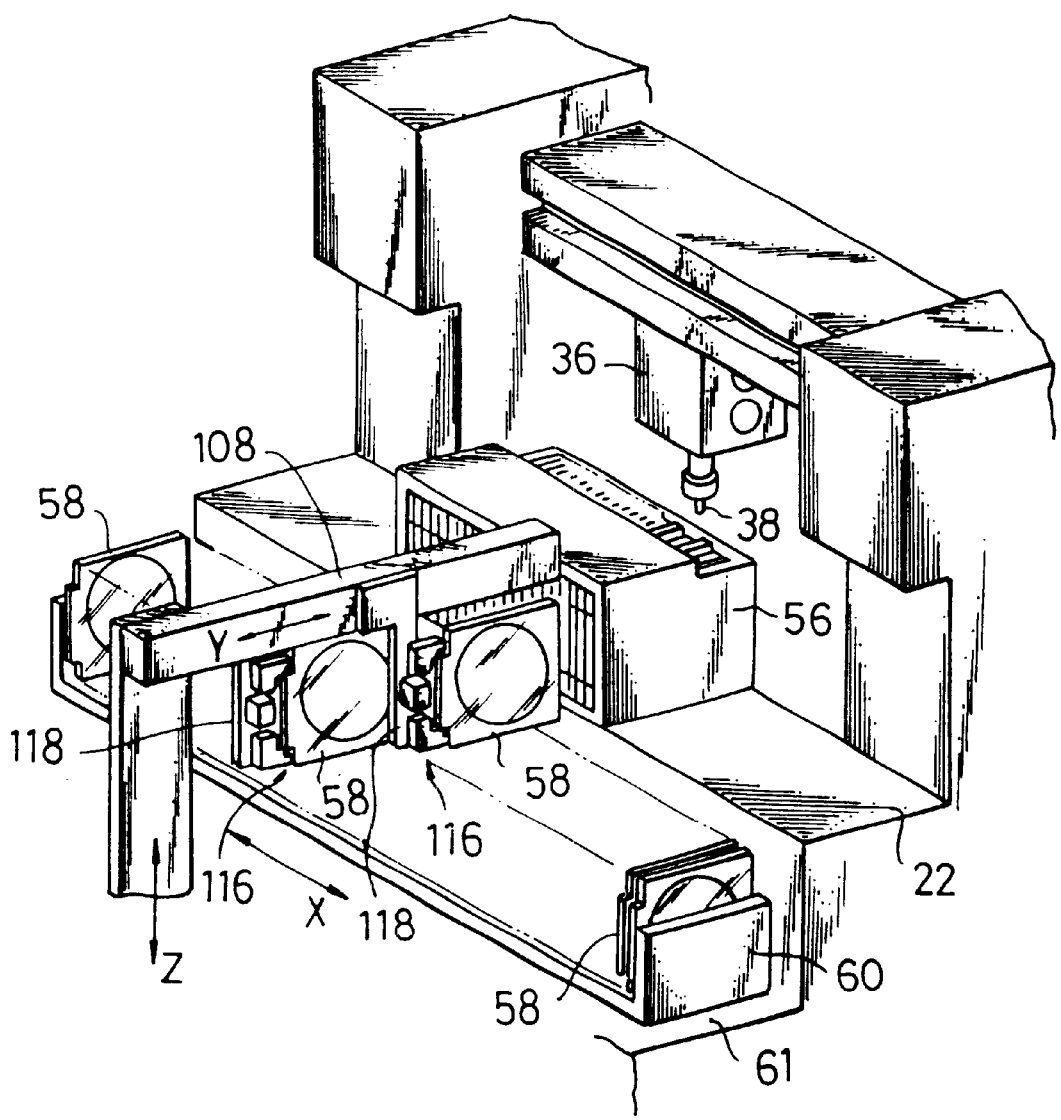
FIG. 5 is a fragmentary perspective view generally showing a storage replacement unit incorporated in the chip mounting apparatus shown in FIG. 1.
Figure 6:
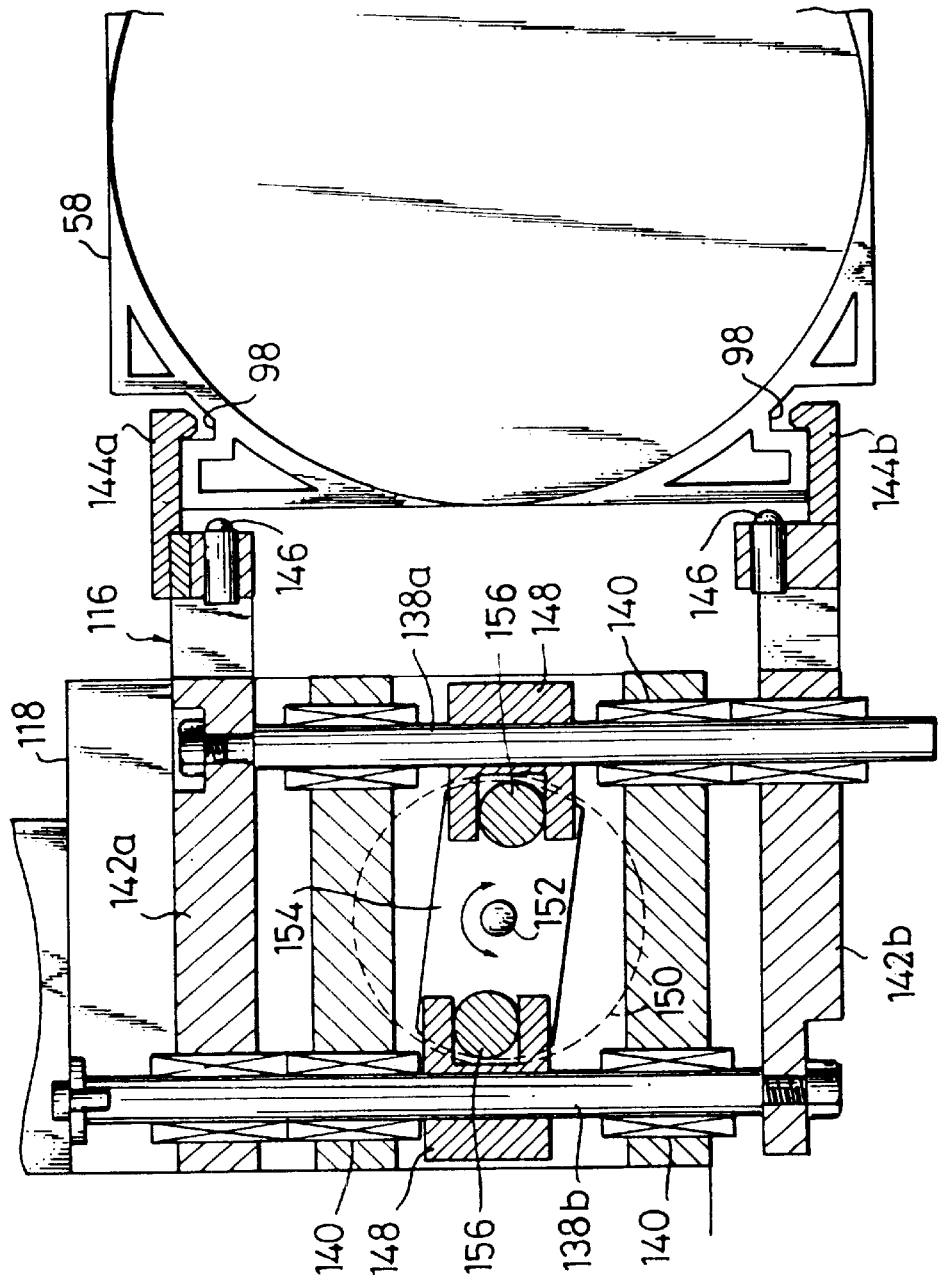
FIG. 6 is an enlarged fragmentary sectional side elevation view showing an essential part of a storage replacement mechanism of the storage replacement unit shown in FIG. 5.

The chip mounting apparatus of the illustrated embodiment also includes a mechanism for replacement of the chip storage package (hereinafter referred to as "package replacement mechanism"), which is arranged so as to carry out replacement of the chip storage package 58 between the feeder section 56 and the stocker section 60, as shown in FIGS. 3, 5 and 6.

Prior to description on the package replacement mechanism, the chip storage package 58 will be described.

Figure 7:
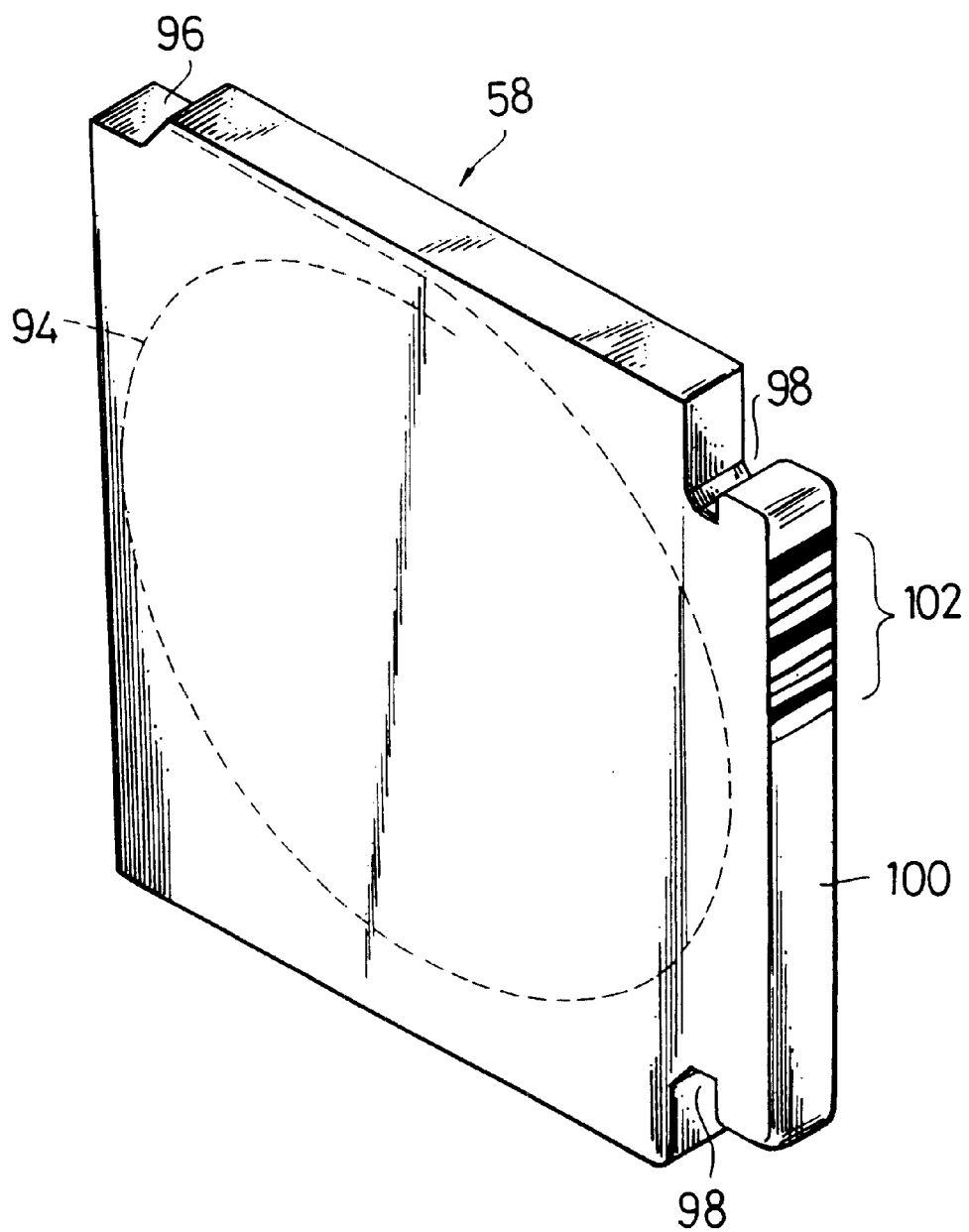
FIG. 7 is a perspective view showing a chip storage package having a bar code attached thereto.

The chip storage package 58, as shown in FIG. 7 and briefly described above, is constructed so as to store a predetermined type of chips in the spirally continuous packing path formed therein, which is designated at reference numeral 94 in FIG. 7. The chip storage package 58 is provided at an upper end of one side thereof constituting a distal end of the packing path 94 with a suction stage 96, at which each of the chips is exposed, to thereby permit the chip suction nozzle 38 to extract the chip by suction. Also, the chip storage package 58 is formed at upper and lower ends of the other side thereof with engagement recesses 98. Further, as shown in FIG. 7, the chip storage package 58 is provided on an end surface 100 of the other side thereof with a bar code 102 for indicating a type of chips stored in the chip storage package 58. This is accomplished, for example, by attaching a seal having the bar code 102 printed thereon to the end surface 100.

The package replacement mechanism, as shown in FIG. 3, includes an X-direction transfer frame 104 supported on X-direction guide rails 106 so as to be slidable in the X direction and an inverted L-shaped support frame 108 supported on a linear guide 110 so as to be slidable in a vertical direction or in the Z direction. The X-direction guide rails 106 are fixedly mounted on the base 22 and the linear guide 110 is fixedly mounted on the X-direction transfer frame 104. The package replacement mechanism also includes a Y-direction slider 112 slidably supported on a linear guide 114 fixedly mounted on each of both sides of a horizontal portion of the inverted L-shaped support frame 108 and a hand section 116 assembled on a support plate 118 integrally fixed on each of the Y-direction sliders 112. Thus, it will be noted that two such hand sections 116 are arranged as shown in FIG. 5. Such arrangement of the two hand sections 116 reduces time required for replacement of the chip storage packages. The Y-direction sliders 112 each are arranged so as to be slidable in the Y direction.

The X-direction transfer frame 104 is mounted with a ball screw nut 120, with which an X-direction worm screw shaft 122 is threadedly engaged. The X-direction worm screw shaft 122 is driven or rotated through a motor 124 mounted on the base 22, so that the X-direction transfer frame 104 may be moved in the X direction. The X-direction transfer frame 52 is rotatably mounted thereon with a Z-direction worm screw shaft 126, which is threadedly engaged with a ball screw nut 128 provided on the side of the inverted L-shaped support frame 108. Thus, driving or rotation of the Z-direction worm screw shaft 126 through a motor 130 mounted on the X-direction transfer frame 104 causes the inverted L-shaped support frame 108 to be moved in the Z or vertical direction. Also, the inverted L-shaped support frame 108 is rotatably mounted thereon with a Y-direction worm screw shaft 132, which is threadedly engaged with a ball screw nut 134 provided on the Y-direction slider 112, so that driving or rotation of the Y-direction worm screw shaft 132 through a motor 136 arranged on the support frame 108 leads to movement of the Y-direction slider 112 in the Y or lateral direction. Thus, the hand sections 116 each are moved in the X, Y and Z directions. In this instance, the mechanism for driving in the X and Z directions is common to both hand sections 116, so that both hand sections may be concurrently moved. However, the mechanisms for drive of both hand sections 116 in the Y direction are independent from each other, therefore, both hand sections 116 are moved independent from each other in the Y direction.

Each of the hand sections 116, as briefly shown in FIG. 3 and detailedly shown in FIG. 6, includes a pair of slide rods 138a and 138b vertically slidably mounted on the support plate 118 through thrust bearings 140, a pair of parallel bars 142a and 142b fixed at ends of the slide rods 138a and 138b so as to be movable in parallel to each other, a pair of engagement hooks 144a and 144b fixed on one end of the parallel bars 142a and 142b so as to be opposite to each other, and pair of ball plungers 146 mounted on the one end of the parallel bars 142a and 142b. The ball plungers 146 each include a ball and a spring for urging the ball in a direction of projecting it form the one end of the bar. The slide rods 138a and 138b each are mounted on an intermediate portion thereof with a U-shaped engagement member 148 in such a manner that an opening of the member 148 may be inwardly directed. The support plate 118 is mounted thereon with a rotary actuator 150 including a revolving shaft 152, on which a rotation plate 154 is fixed. The rotation plate 154 is fixedly mounted with a pair of pins 156 which are engaged with the U-shaped engagement members 148.

The engagement hooks 144a and 144b are formed into a configuration which permits the hooks to be engaged with the engagement recesses 98 of the chip storage package 58 and are varied in interval therebetween depending on actuation of the rotary actuator 150. More particularly, the interval between the hooks 144a and 144b is decreased when the rotary actuator 150 rotates the rotation plate 154 in a clockwise direction in FIG. 6 and increased when the former rotates the latter in a counterclockwise direction. Thus, a combination between movement of the support plate 118 in X, Y and Z directions and operation of the engagement hooks 144a and 144b permits holding, transfer and release of the chip storage package 58 to be selectively carried out as desired.

The inverted L-shaped support frame 108, as shown in FIG. 3, is fixedly mounted with an upper side guide member 158 which is adapted to be engaged with an upper side of the chip storage package 58 held on each of the hand sections 116.

The mechanism for moving each of the hand sections 116 in the X and Y directions and that for moving the hand sections independent from each other in the Y direction may be modified as desired. Also, the mechanism for operating the engagement hooks 144a and 144b may be likewise modified as desired.

The feeder section 56 may be provided with a chip sensor for detecting residue of chips stored in each of the chip storage packages 58, so that when the chip sensor detects that the chip storage package is emptied of chips, operation of the package replacement mechanism including the hand sections 116 is started based on the detection. More particularly, the first hand section 116 which is positioned on the left side in FIG. 5 transfers a new chip-filled chip storage package 58 of the same type as a chip-free or empty chip storage package 58 from the stocker section 60 to a position of the feeder section 56 opposite to the stocker section while holding it by chucking, whereas the second hand section 116 which is positioned on the right side in FIG. 5 removes the empty chip storage package 58 from the feeder section 56. Then, the first hand section 116 is moved by a distance equal to a pitch in the X direction between the first hand section and the second hand section to insert the new chip storage package 58 into the feeder section 56 (or advanced in the Y direction). In this instance, a deviation between the amount of movement of the chip storage package 58 required for inserting the package into the feeder section 56 and that of movement of the hand section required for the insertion is absorbed by the ball plungers 146 mounted on the distal end surface of the parallel bar 142a and 142b. More particularly, the balls of the ball plungers 146 are abutted against a rear end surface of the chip storage package 58 at the end of insertion of the package into the feeder section 56, to thereby force it into a predetermined position in the feeder section 56. Thus, it will be noted that the package replacement mechanism permits replacement of the chip storage packages between the feeder section 56 and the stocker section 60 to be rapidly and positively carried out.

Now, the manner of operation of the chip mounting apparatus of the illustrated embodiment constructed as described above will be described hereinafter with reference to FIGS. 8 to 11 as well as FIGS. 1 to 2.

First, the board mark observing camera 44 mounted on the chip mounting head 36 picks up an image of a positioning mark provided on the printed circuit board 62 located at a predetermined position by means of the board positioning mechanism 64. The positioning mark may be provided so as to have a predetermined positional relationship to a chip mounted position on the printed circuit board 62. A positional relationship between the chip mounting head 36 and the board mark observing camera 44 is predetermined, therefore, it is possible to accurately know the chip mounted position on the printed circuit board 62 through an image processing unit for processing a video signal of the board mark observing camera 44 based on an image of the positioning mark on the printed circuit board 62.

When the chip suction nozzle 38 of the chip mounting head 36 is to extract a chip 90 from a suction stage 96 of a desired chip storage package 58 in the feeder section 56 by suction, the chip mounting head 36 is moved in the X-Y directions to cause the chip suction nozzle 38 to be moved to a position right above the suction stage of the selected chip storage package 58 and the air cylinder 88 is actuated to retract the first plane mirror 78 and support arm 86 to a position which prevents both from interfering with operation of the chip suction nozzle 38. Then, the chip suction nozzle 38 is downwardly moved to extract the chip 90 from the suction stage 96 of the chip storage package 58 by suction and then returned to a raised position. Thereafter, the chip suction nozzle 38 is moved to the chip mounted position on a printed circuit board 62 located at a predetermined position.

Figure 8:
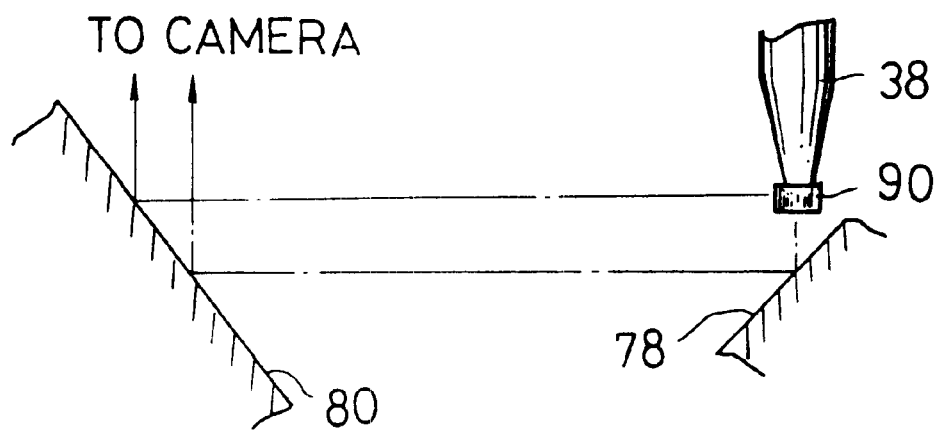
FIG. 8 is a schematic view showing picking-up of an image of a chip held on a chip suction nozzle.
Figure 10:
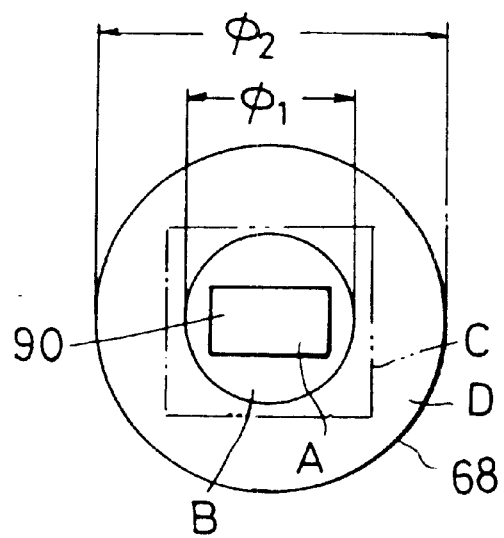
FIG. 10 is a schematic plan view showing a relationship between a chip suction nozzle and a contour of a chip held on the chip suction nozzle which is provided due to lighting by the lighting unit shown in FIG. 9.

After the chip suction nozzle 38 is returned to the raised position, the first plane mirror 78 and support arm 86 are returned to the original position, resulting in the first plane mirror 78 being positioned right below the chip suction nozzle 38 as shown in FIG. 8. During movement of the chip mounting head 36 to the chip mounted position, the light emitting diodes 72 of the lighting unit 50 are turned on to laterally irradiate the nozzle cap 68 of the chip suction nozzle 38 with light as shown in FIG. 10. The nozzle cap 68, as described above, is made of a semi-opaque (translucent) resin material or the like, to thereby exhibit a function of partially transmitting light and irregularly reflecting it, so that the nozzle cap 68 on which the chip 90 is held by suction looks as if it emits light. Thus, the nozzle cap 68 exhibits a lighting function with respect to the chip 90 held on the distal end of the nozzle cap as in employment of backlighting. This causes a dark shadow A to be formed inside a contour of a bottom surface of the chip 90, resulting in an image of the bottom surface which has a bright background B being provided, as shown in FIG. 10. Then, the image thus formed, as shown in FIG. 8, is reflected by the first plane mirror 78, to thereby be directed to the second plane mirror 80, which then reflects the image, so that it is directed to the chip observing camera 42. This permits the chip observing camera 42 to pick up the image of the contour of the bottom of the chip 90.

Figure 11:
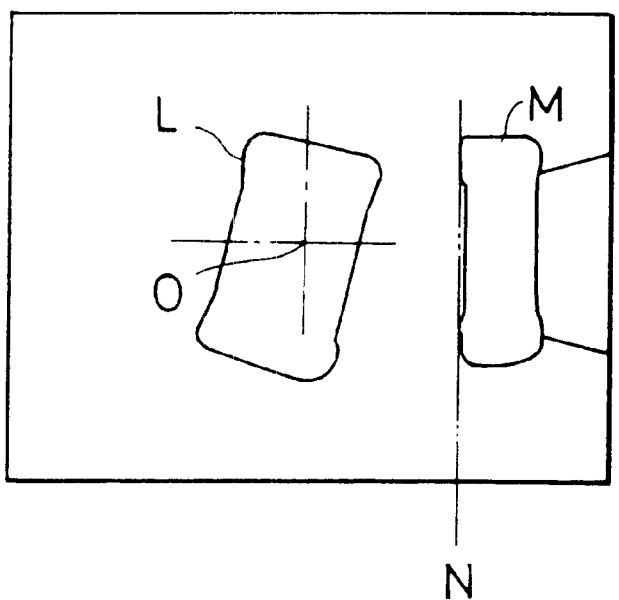
FIG. 11 is a schematic view showing an example of images of a chip held on a chip suction nozzle of a chip mounting head which are picked up by a chip observing camera.
Figure 9:
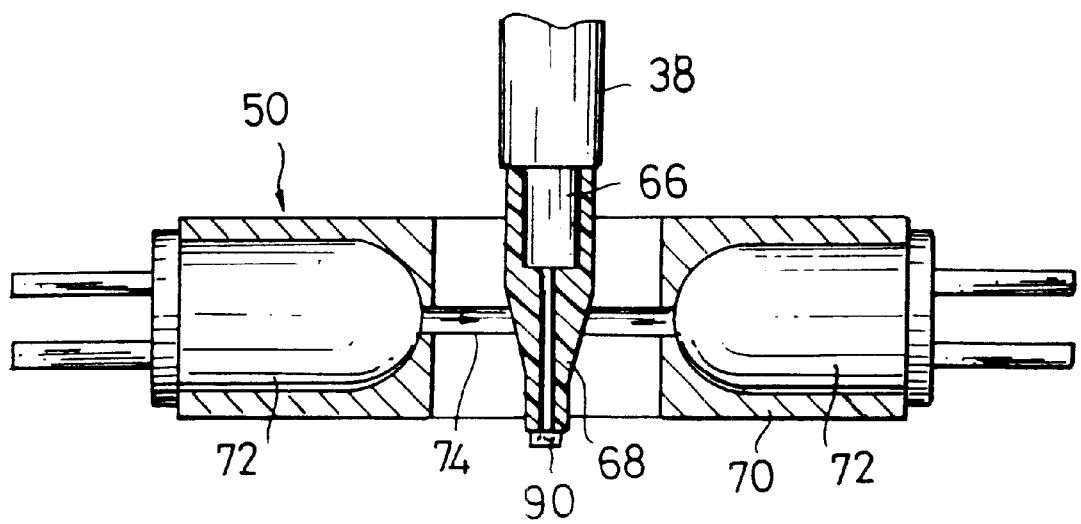
FIG. 9 is an enlarged sectional view showing an essential part of a lighting unit for a chip held on a chip suction nozzle of a chip mounting head.

In addition, an image of a side surface of the chip 90, as shown in FIG. 8, is directly reflected by the second plane mirror 80, to thereby be input to the chip observing camera 42. Thus, the chip observing camera 42 picks up such images as shown in FIG. 11, wherein L indicates the image of the bottom end surface of the chip 90 described above and M is an image of the side surface of the chip. A posture of the chip 90 suckedly held on the chip suction nozzle 38 is visually recognized on the basis of the image L through the image processing unit adapted to process a video signal of the chip observing camera 42. Concurrently, positional deviation of the chip 90 from a center 0 (FIG. 11) of the nozzle cap 68 can be detected because it is possible to previously know a positional relationship between the chip observing camera 42 and the center of the nozzle cap 68. The positional deviation includes deviation of chip in the X-Y directions and deviation in a rotation direction of the chip. Also, it is possible to detect a straight line N contiguous to a portion of the contour of the image M opposite to the chip suction nozzle 38, because it is possible to previously know a vertical position of the lower end surface of the chip suction nozzle 38. Thus, it will be noted that the illustrated embodiment permits the amount of lowering of the chip suction nozzle during mounting of the chip on the printed circuit board to be controlled with high accuracy due to detection of a height of every chip. This indicates that a necessity of separately providing any additional sensor for detecting a height of the chip or moving the chip mounting head to the sensor is eliminated, to thereby contribute to simplification of the apparatus and efficient mounting of the chip 90 on the printed circuit board 62.

In FIG. 10, $\phi_1$ indicates an outer diameter of the distal end surface of the nozzle cap 68 and $\phi_2$ is an outer diameter of a proximal portion of the nozzle cap. The nozzle cap 68 brightens due to irregular reflection even when the contour of the chip 90 is inside the outer diameter $\phi_1$, so that the background of the chip 90 may be lighted. Also, even when the contour of the chip 90 exceeds the outer diameter $\phi_1$ of the distal end surface of the nozzle cap as indicated at phantom lines C, the proximal end of the nozzle cap 68 which is increased in diameter likewise brightens due to irregular reflection, so that a background D of the chip is likewise lighted, resulting in an accurate image of the chip 90 being provided.

Thus, the lighting unit exhibits substantially the same function as back-lighting without excessively reducing a size of the nozzle for holding the chip thereon by suction, to thereby effectively carry out lighting of a microminiature chip. Also, the nozzle cap 68 is replaceably mounted on the nozzle body 66; therefore, when it is polluted or damaged, it is readily replaced. Also, the light emitting diodes are integrally incorporated as a light source in the bracket 70, so that the nozzle cap 68 may be highly down-sized.

Thus, the image of the chip 90 is observed before the chip mounting head 36 reaches the chip mounted position on the printed circuit board 62, resulting in mounting of the chip 90 on the printed circuit board 62 being satisfactorily accomplished in view of positional deviation of the chip with respect to the chip suction nozzle 38. More particularly, a position at which the chip mounting head 36 is topped is determined to offset the positional deviation, to thereby ensure that the chip 90 is accurately mounted on the chip mounted position. This permits chip mounting to be executed with high accuracy. When the mounting is carried out, actuation of the air cylinder 88 causes the first plane mirror 78 and support arm 86 to be retracted to the position which prevent the mirror 78 and arm 86 from interfering with the mounting. After the mounting is completed, the chip mounting head 36 is moved to the position right above a suction stage 96 of a desired chip storage package 58 for extraction of the next chip from the package.

The second plane mirror 80 may be constructed so as to be retractable from a position right below the chip observing camera 42 through a mechanism similar to that for the first plane mirror 78. Such construction permits an image of the positioning mark on the printed circuit board to be picked up through the camera 42, so that inspection of a wiring pattern on the printed circuit board 62 prior to the chip mounting operation and inspection of a state of the chip mounted on the board 62 may be conveniently executed. In this instance, arrangement of the board mark observing camera 44 may be eliminated.

The feeder section 56 may be provided with a chip sensor for detecting residue of chips stored in each of the chip storage packages 58, so that When the chip sensor provided on the feeder section 56 detects that the chip storage package is emptied of chips, operation of the package replacement mechanism including the hand sections 116 is started based on the detection. Thus, the first hand section 116 which is positioned on the left side in FIG. 5 transfers a new chip-filled chip storage package 58 of the same type as a chip-free or empty chip storage package 58 from the stocker section 60 to a position of the feeder section 56 opposite to the stocker section while holding it by chucking, whereas the second hand section 116 which is positioned on the right side in FIG. 5 removes the empty chip storage package 58 from the feeder section 56. Then, the first hand section 116 is moved by a distance equal to a pitch in the X direction between the first hand section and the second hand section to insert the new chip storage package 58 into the feeder section 56. In this instance, a deviation between the amount of movement of the chip storage package 58 required for inserting the package into the feeder section 56 and that of movement of the hand section required for the insertion is absorbed by the ball plungers 146 mounted on the distal end surface of the parallel bar 142a and 142b. More particularly, the balls of the ball plungers 146 are abutted against a rear end surface of the chip storage package 58 at the end of insertion of the package into the feeder section 56, to thereby force it into a predetermined position in the feeder section. Thus, it will be noted that the package replacement mechanism permits replacement of the chip storage packages between the feeder section 56 and the stocker section 60 to be rapidly and positively carried out.

Figure 12:
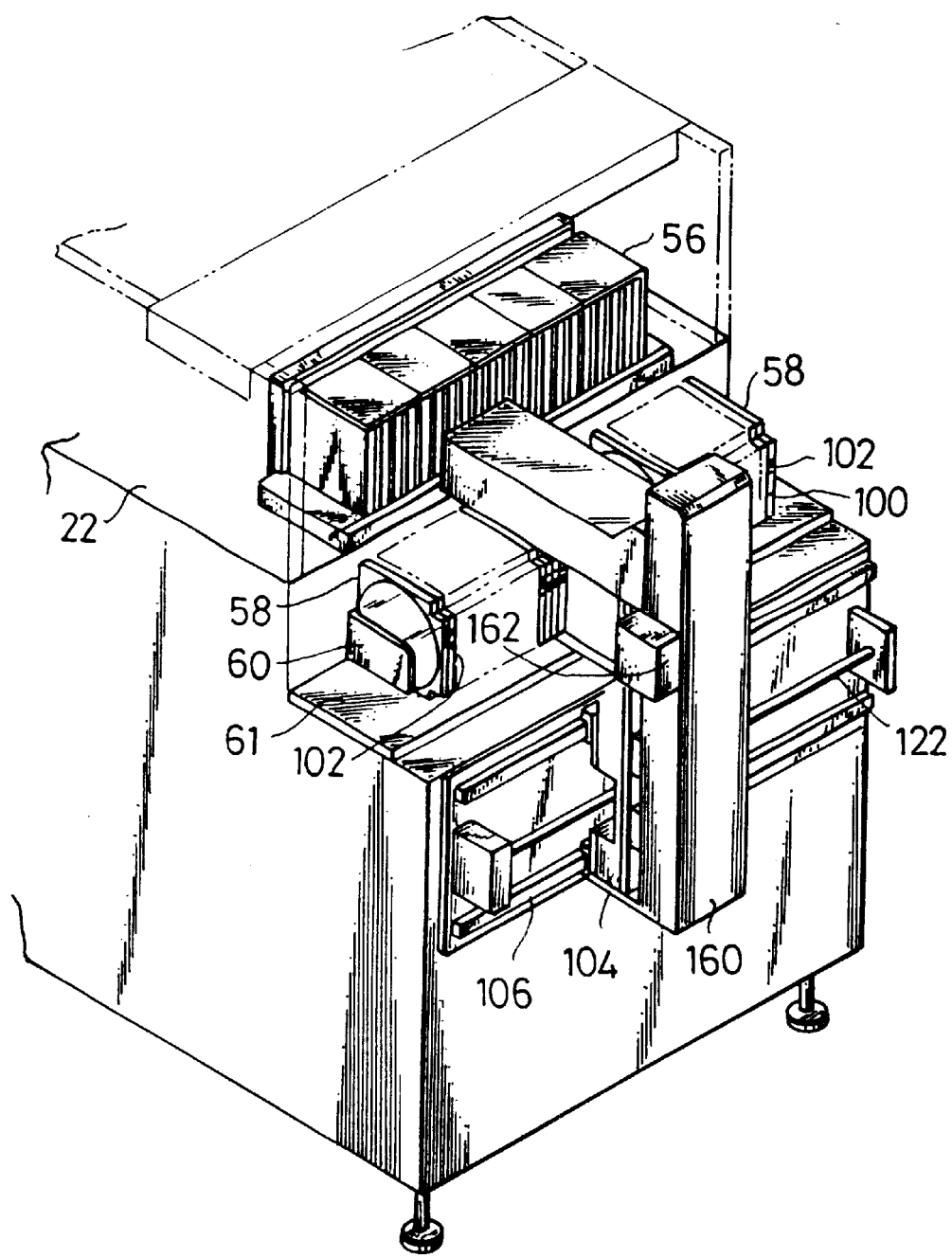
FIG. 12 is a fragmentary perspective view showing a modification of a package replacement mechanism.

The package replacement mechanism may be constructed so as to indicate a type of chips stored in the chip storage package by means of the bar code 102 provided on the end surface of the chip storage package 58, to thereby more smoothly and positively carry out replacement of the chip storage packages when various kinds of chip storage packages are stored in the feeder and stocker sections. For this purpose, the X-direction transfer frame 104, as shown in FIGS. 3 and 12, is integrally mounted thereon with a cover 160 for covering the inverted L-shaped support frame 108, Y-direction slider 112 and mechanisms therefor, which cover 160 is fixedly mounted thereon with a bar code sensor or reader 162 as shown in FIG. 12. Thus, the bar code reader 162 is moved in the X direction with movement of the X-direction transfer frame 104 in the X direction. Also, the bar code reader 162 is arranged at a vertical portion or height which permits the reader to read the bar code 102 of the chip storage package 58 when it is replaceably held in the stocker section 60.

In the package replacement mechanism described above with reference to FIGS. 3 and 12, one of the hand sections 116 removes a chip-free or empty chip storage package from the feeder section 56 and then returns it to an empty-package receiving space of the stocker section 60 for receiving empty chip storage packages therein. Then, the other hand section 116 is actuated for finding out, in the stocker section 60, a new chip-filled chip storage package of the same type as the empty chip storage package while moving the bar code reader 162 in the X direction. Thereafter, the hand section 116 is actuated to transfer the new chip storage package 58 from the stocker section 60 to the feeder section 56, to thereby feed the chip storage package into the feeder section 56 as described above. Thus, it will be noted that the package replacement mechanism more smoothly and positively carries out package replacement operation when various kinds of chip storage packages are stored in the feeder and stocker sections, because the bar code reader 162 detects a type of chips stored in a chip storage package through a bar code 102 provided on the chip storage package. Also, the package replacement mechanism permits chip storage packages to be arranged in the stocker section 60 as desired for storage, to thereby facilitate replenishment and management of chip storage packages with respect to the stocker section.

The chip mounting head unit may be constructed so as to exhibit a function of detecting a height or vertical position of the printed circuit board 62 on which the chip 90 is to be mounted. Such function is more effective when the chip is a surface mounting type such as a chip capacitor, a chip resistor, a chip inductor, a surface mounting type IC or the like.

For this purpose, the chip observing camera 42 acts to carry out observation of a height of the printed circuit board as well as observation of the chip. The chip mounting head 10, as shown in FIG. 4, is mounted thereon through the support arm 76 with a fixture 164, on which a support block 166 is fixed. The support arm 92 is mounted on the support block 166 through a linear guide 168 so as to be movable in the Y direction or in the direction perpendicular to the sheet of FIG. 4. Movement of the support arm 92 in the Y direction is carried out through an air cylinder 170 mounted on the support block 166. When a height of the chip mounted position on the printed circuit board 62 is to be detected by means of the camera 42, the support arm 92 and second plane mirror 80 are laterally moved in the Y direction from the position right below the camera 42 so that the camera 42 may directly pick up an image of a mark 172 indicating the chip mounted position on the printed circuit board 62.

In the chip mounting head unit 34 thus constructed, actuation of the air cylinder 170 causes the support arm 92 and second plane mirror 80 to be retracted from the position right below the camera 42, so that the camera 42 may pick up an image of the mark 172 of the chip mounted position on the printed circuit board 62. The mark 172 is preferably formed into a configuration which permits the camera to be readily focused on the mark.

Figure 13:
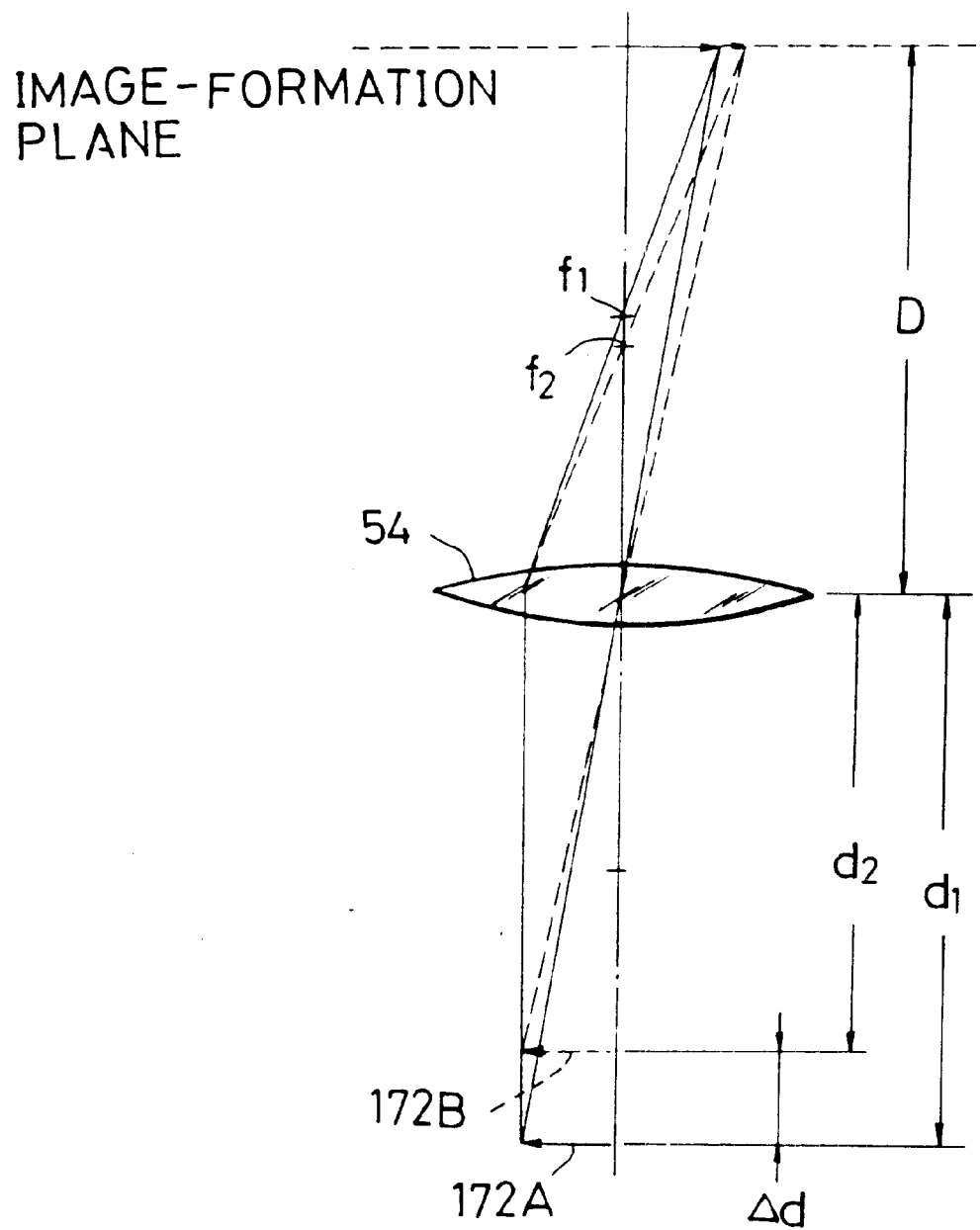
FIG. 13 is a schematic view showing a principle of detection of a height of a printed circuit board by a camera.

FIG. 13 illustrates a principle of detection of a distance between the camera 42 and the printed circuit board 62 based on a focus length (optical system) of the camera by picking up an image of the mark 172 by means of the camera 42 to focus it on the mark. Now, the following description will be made on the assumption that in picking-up of an image of a mark 172A on a surface of the printed circuit board 62 which is located at a normal height (reference height) or at a position spaced by a distance d1 from the lens 54 of the camera 42, a distinct image is which is in focus is formed on an image-formation plane or photo-detection plane (a distance D from the lens to the plane being constant) when a focus of the lens 54 is at a position of f1. When the surface of the printed circuit board is raised by a distance of d due to warpage of the printed circuit board, twist thereof or the like, it is required to move the focus of the lens 54 to a position of f2 in order to permit a distinct image of a mark 172B on the printed circuit board which is spaced by a distance d2 from the lens 54 to be formed on the image-formation plane while being in focus. It is possible to previously know movement of the focus of the lens 54 or a relationship between the amount of variation of the focus length and the amount of displacement of the printed circuit board with respect to the reference height, therefore, a distance between the lens 54 and the printed circuit board may be detected based on the focus length of the lens.

Thus, detection of a height of the chip 90, as well as detection of a height of the surface of the printed circuit board 62 on which the chip is to be mounted permits the amount of downward movement of the chip suction nozzle 38 for mounting of the chip on the printed circuit board to be controlled with high accuracy, to thereby minimize damage to the chip 90 and accomplish mounting of the chip 90 on the printed circuit board with high accuracy. The chip mounting head unit thus constructed is applied to a lead-free chip. However, application of the unit to a surface-mounting type IC or the like which includes lead terminals for surface mounting permits the advantage of the unit to be further promoted.

Thus, the chip mounting head unit exhibiting the board height detecting function is so constructed that the chip mounting head is provided with the board height detecting camera. Such construction permits a height of the printed circuit board at the chip mounted position on the printed circuit board to be detected for every chip, to thereby minimize damage to the chip and execute chip mounting operation with high accuracy.

As can be seen from the foregoing, in the chip mounting apparatus of the present invention, the chip observing camera is provided on the side of the chip mounting head, so that an image of the chip held on the chip mounting head may be satisfactorily picked up through the camera during movement of the chip mounting head to the printed circuit board, resulting in the chip mounting operation being executed at an increased speed. Also, the chip mounting apparatus is constructed so as to exhibit the automatic package replacement function, to thereby carry out continuous running over a long period of time.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A lighting unit for lighting a chip held on a chip suction nozzle, comprising:

a translucent nozzle cap fitted on a nozzle body of the chip suction nozzle and having a distal end surface for holding a chip thereon by suction;

an annular bracket made of an opaque material and formed on an inner peripheral surface thereof with a slit;

said annular bracket being arranged so as to surround said nozzle cap; and a plurality of light emitting diodes mounted on said bracket to laterally light said nozzle cap through said slit.

2. A chip mounting head unit having a board height detecting function, comprising:

a chip mounting head including a chip suction nozzle for holding a chip thereon by suction; and a camera integrally mounted on said chip mounting head for movement with said chip mounting head in a direction towards the circuit board;

said camera being operative to detect a positioning mark on a circuit board and to thereby measure a distance between the camera and the surface of the circuit board.

3. A chip mounting head unit as defined in claim 2, wherein the chip to be mounted on the printed circuit board is a surface-mounting type.

4. A chip mounting head unit having a camera integrally mounted thereon, comprising:

a chip mounting head including a chip suction nozzle for holding a chip thereon by suction;

said camera being mounted on said chip mounting head;

a lighting means mounted on said chip mounting head to light a background of a chip held on said chip suction nozzle; and a reflection means mounted on the side of said chip mounting head to input an image of the chip held on said chip suction nozzle to said chip observing camera;

said reflection means including a first mirror disposed beneath said chip mounting head for reflecting the image of the chip held by the chip suction nozzle.

5. A chip mounting head unit as defined in claim 4, wherein said reflection means includes a first plane mirror disposed at an oblique angle to the central axis defined by said chip suction nozzle and a second plane mirror arranged with said first plane mirror to reflect said image of the chip to said camera.

6. A chip mounting head unit as defined in claim 5, wherein only said second plane mirror reflects an image of a side surface of the chip held on said chip suction nozzle to input the image to said camera.

7. A chip mounting head unit as defined in claim 6, wherein said first plane mirror is arranged so as to be retractable to a position apart from the position below said chip suction nozzle.

8. A chip mounting head unit as defined in claim 5, wherein said first and second plane mirrors of said reflection means reflect an image of a lower surface of the chip held on said chip suction nozzle to input the image to said camera.

9. A chip mounting head unit as defined in claim 8, wherein only said second plane mirror reflects an image of a side surface of the chip held on said chip suction nozzle to input the image to said camera.

10. A chip mounting head unit as defined in claim 2 wherein said camera is a variable focus camera which detects distance between the camera and the surface of the circuit board by varying the focus.

* * * * *

UNITED STATES PATENT AND TRADEMARK OFFICE
CERTIFICATE OF CORRECTION

PATENT NO.   : 6,435,808 B1
DATED        : August 20, 2002
INVENTOR(S)  : Shinichi Araya It is certified that error appears in the above-identified patent and that said Letters Patent is hereby corrected as shown below:

<u>Title page,</u>
Item [75], Inventors, "Honjou" should read -- Honjou-shi --.
Item [57], ABSTRACT,
Line 7, "chip hold on" should read -- chip held on --
Line 11, "held a chip" should read -- hold a chip --.

<u>Column 9,</u>
Line 38, "FIGS. 1 to 2" should read -- FIGS. 1 to 7 --.

Signed and Sealed this

Fourth Day of March, 2003

JAMES E. ROGAN
*Director of the United States Patent and Trademark Office*